United States Patent [19]
Yokoyama

[11] Patent Number: 5,247,204
[45] Date of Patent: Sep. 21, 1993

[54] SEMICONDUCTOR DEVICE HAVING MULTILAYER INTERCONNECTION STRUCTURE

[75] Inventor: Kenji Yokoyama, Suwa, Japan

[73] Assignee: Seiko Epson Corporation, Tokyo, Japan

[21] Appl. No.: 707,692

[22] Filed: May 30, 1991

[30] Foreign Application Priority Data

Jun. 5, 1990 [JP] Japan .................................. 2-146753
Jun. 5, 1990 [JP] Japan .................................. 2-146754

[51] Int. Cl.⁵ ........................................... H01L 23/48
[52] U.S. Cl. .................................. 257/750; 257/751; 257/774
[58] Field of Search ........................... 357/65, 71, 68; 257/750, 751, 774

[56] References Cited

U.S. PATENT DOCUMENTS 4,996,584  2/1991  Young et al. ........................ 357/71
5,001,541  3/1991  Virkus et al. ........................ 357/65

Primary Examiner—Rolf Hille
Assistant Examiner—Roy Potter
Attorney, Agent, or Firm—Spensley Horn Jubas & Lubitz

[57] ABSTRACT

Interconnection layers are laid on top of one another with an interlayer insulating film therebetween and are electrically connected to each other by a connection portion formed by plating so as to achieve improvement in the initial characteristics and reliability of the multilayer interconnection structure.

5 Claims, 8 Drawing Sheets

FIG. 6 (a) PRIOR ART
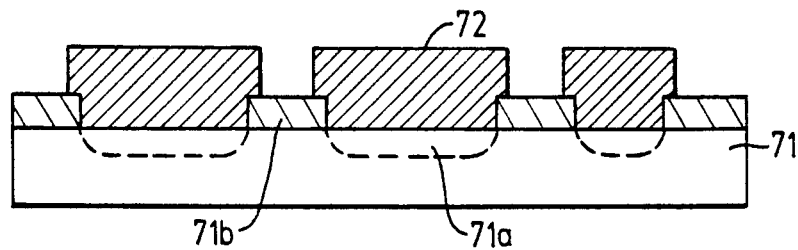
FIG. 6 (b) PRIOR ART
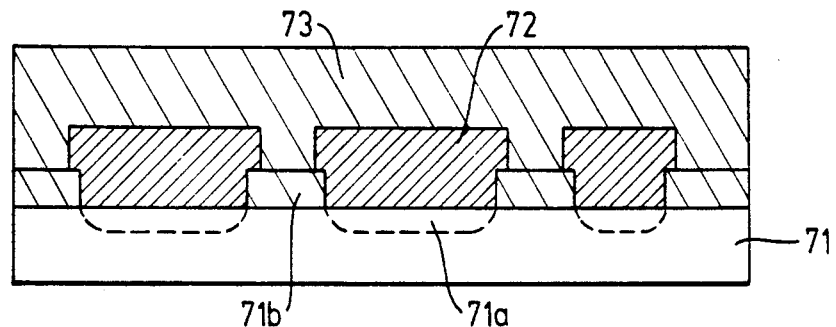
FIG. 6 (c) PRIOR ART
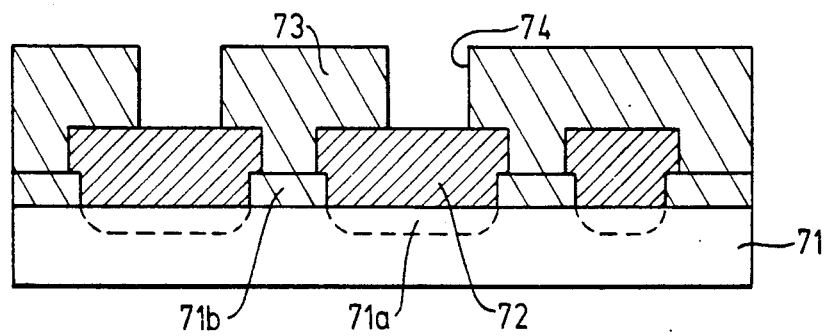
FIG. 6 (d) PRIOR ART
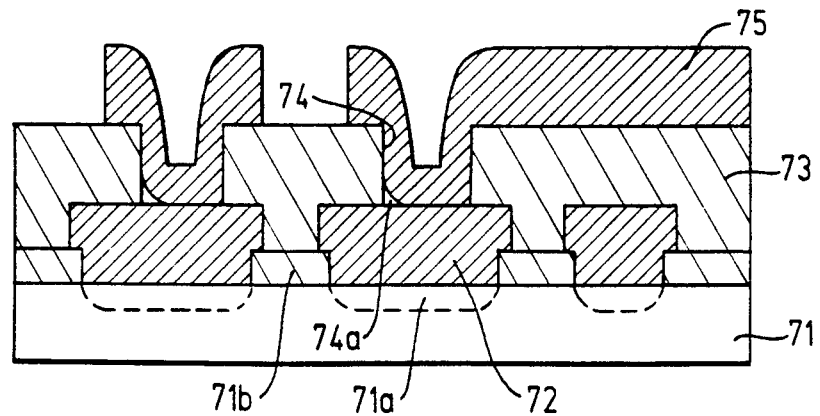

SEMICONDUCTOR DEVICE HAVING MULTILAYER INTERCONNECTION STRUCTURE

BACKGROUND OF THE INVENTION

1. Field of the Invention

The present invention relates to a semiconductor device having a multilayer interconnection structure and a method of manufacturing such a semiconductor device.

2. Prior Art

Conventional interconnection techniques for semiconductor devices adopt a configuration in which interconnection wiring is arranged in layers laid on top of another with an insulating film provided between the adjacent interconnections layers and in which the wiring formed by an upper interconnection layer is electrically connected to that of an underlying interconnection layer through connection holes formed in the insulating film. This interconnection configuration can significantly affect the characteristics and reliability of the semiconductor device.

Such a multilayer interconnection configuration will be described below with reference to FIGS. 6(a) to 6(d) which show successive stages in a conventional process for manufacturing semiconductor devices.

FIG. 6(a) shows a semiconductor device based on a substrate 71 provided with semiconductor regions 71a, e.g. doped regions, and having an insulating layer 71b formed on its upper surface. A first interconnection layer 72 is composed of wiring formed on the surface of substrate 71 in contact with semiconductor regions 71a. The wiring constituting first interconnection layer 72 is formed by patterning a conductive material deposited on the substrate by sputtering.

To provide a second interconnection layer which provides a second wiring pattern on the semiconductor substrate 71 arranged in the manner described above, an interlayer insulating film 73 is first deposited from above the first interconnection layer 72, as shown in FIG. 6(b), and then connection holes 74 are opened for connecting the first interconnection layer 72 to the second interconnection layer to be formed on the surface of the interlayer insulating film 73, as shown in FIG. 6(c). On the surface of the semiconductor substrate 71 which is in the above-described state, a metal material is deposited by sputtering so as to form a metal layer on the surface of the interlayer insulating film 73 and to fill the connection holes 74. Thereafter, the metal layer is patterned, e.g. by conventional selective etching processes, to form a second interconnection layer 75. Layer 75 provides a wiring pattern composed of connecting paths which are connected to selected paths of first interconnection layer 72 through the connection holes 74 in the interlayer insulating film 73.

In the conventional procedures for manufacturing semiconductor devices, since the connecting holes 74 in the interlayer insulating film 73 are filled from above the semiconductor substrate 71 with metal of the second interconnection layer, the quality of the connection between the paths provided by layers 72 and 75 is more affected by the shape of the lower layer. For example, deposition of the metal material of layer 75 to the lower portion of a connection hole 74 may be impeded or prohibited by the presence of metal material attached to the vicinity of the opening of the top of the connection hole, resulting in the creation of a void in a corner portion 74a at the bottom of the connection hole 74, as shown in FIG. 6(d).

Moreover, since the metal wiring material is not easily deposited on the inner peripheries of connection holes 74, the portion of the second interconnection layer 75 which is located within connection holes 74 may be quite thin.

Such failures associated with coverage by a metal layer providing interconnection wiring lead to an initial connection failure, or open circuit, or a connection failure which appears after a certain period of time due to electromigration or the like. Therefore, it would be desirable to eliminate the causes of such failures.

In order to overcome the aforementioned problems, it has already been proposed to utilize plated interconnection layers as shown in FIG. 7. FIG. 7 shows a semiconductor device in which a conductive subbing layer 83 is deposed on the surface of an interlayer insulating film 82 and on the inner surfaces of connecting holes 82a. In this semiconductor device, a second interconnection layer 84 is deposited and the interiors of the connecting holes 82a are filled with the second interconnection layer 84 by plating which is conducted using the conductive subbing layer 83 as the plating electrode. Therefore, the metal layer can be reliably caused to grow from the surface of the conductive subbing layer 83, and the aforementioned coverage can thus be improved. However, in this method, as the conductive subbing layer 83 is present on the side surface of the connection hole 82a also, if the aspect ratio of the connection hole 82a is high, the metal of second interconnection layer 84 which grows in the vicinity of the top 82b of the connection hole 82a tends to plug the top 82b, thus giving rise to a void 84b in the interior of the connection hole 82a. Consequently, the electric resistance in the interior of the connection hole 82a may be increased, or disconnection may eventually occur due to electromigration. Thus, there are limitations to the range to which plating can be applied to the interconnection structure.

As semiconductor device dimensions, and the lateral length of a single semiconductor device, are reduced, the aspect ratio of the connection holes is increased, thus increasing the likelihood of occurrence the above-described problems.

In view of the aforementioned problems of the conventional technique, an object of the present invention is to provide a semiconductor device in which formation of a connecting portion for electrically connecting interconnection layers to each other is started only from the surface of the interconnection layer located below the connection portion by plating so as to improve the initial characteristics and the reliability.

The above and other objects are achieved, according to the present invention, by the provision of a semiconductor device having a multilayer interconnection structure, comprising: a semiconductor substrate having an upper surface provided with a patterned interconnection area containing semiconductor element regions; a conductive first subbing layer deposited on the patterned interconnection area; a first interconnection layer composed of first interconnection layer portions deposited on the conductive subbing layer and electrically connected to the semiconductor element regions through the conductive subbing layer; a metal connection layer composed of connection layer portions formed on the first interconnection layer portions by plating; an interlayer insulating film deposited on the first interconnection layer portions around the metal connection layer portions for burying the metal connection layer portions in such a manner that the tops of the metal connection layer portions are exposed; and a second interconnection layer composed of second interconnection layer portions deposited on the interlayer insulating film and electrically connected to the first interconnection layer portions through the metal connection layer portions.

The objects of the invention are further achieved by the practice of a method of manufacturing a semiconductor device having a multilayer structure, comprising: providing a semiconductor substrate having an upper surface provided with a patterned interconnection area containing semiconductor element regions; depositing a conductive subbing layer on the upper surface of the semiconductor substrate; depositing a first interconnection layer composed of first interconnection layer portions on the conductive subbing layer; covering the first interconnection layer with a mask having windows corresponding to portions of a metal connection layer; forming, in the mask windows, a metal connection layer composed of connection layer portions on portions of the first interconnection layer; removing the mask from the first interconnection layer; removing portions of the conductive subbing layer from locations surrounding the portions of the first interconnection layer; forming an interlayer insulating film on the first interconnection layer portions around the metal connection layer portions for burying the metal connection layer portions in such a manner that the tops of the metal connection layer portions are exposed; and depositing a second interconnection layer composed of second interconnection layer portions on the interlayer insulating film.

In a case where the first interconnection layer is formed on the surface of the conductive subbing layer by plating, the first interconnection forming step includes a step of covering the surface of the conductive subbing layer with a mask having a window portion corresponding to a patterned interconnection area of the first interconnection layer to be formed, and a step of forming by plating the first interconnection layer on the portion of the surface of the conductive subbing layer which is located in the window portion. This mask is removed in the mask removing step. In that case, it is desired to form the first interconnection layer in such a manner that the side surfaces of the first interconnection layer portions are tapered so as to make the tops thereof are narrower than the bottoms, thereby allowing the interlayer insulating film to be deposited more reliably close to the side surfaces of the first interconnection layer portions.

This is achieved by the use of a mask made of a negative type photoresist during the first interconnection layer forming process.

The insulating film forming procedure includes the step of depositing the insulating film from above the first interconnection layer in such a manner that the upper portion of the metal connection layer is covered with the insulating film, and the step of conducting etch back until at least the surface of the metal connection layer is exposed. In that case, it is desired that the etch back be conducted until the upper portion of the metal connection layer protrudes from the surface of the interlayer insulating film so as to increase the contact area between the metal connection layer and the second interconnection layer.

The subbing layer removing step includes dry etching which is conducted using the first interconnection layer as a mask. It is desired to make the periphery of the upper surface of the metal connection layer and the periphery of the upper surface of the first interconnection layer a curved surface so that the interlayer insulating film is deposited close to the first interconnection layer. This is achieved by conducting dry etching until the upper surface of the metal connection layer and the upper surface of the first interconnection layer are removed.

The first interconnection layer, the metal connection layer and the second interconnection layer are made of a metal selected from the group consisting of Au, Ag and Cu.

It is also desired to construct the conductive subbing layer so that it is composed of a lower layer made of a metal which is either Ti or Mo and an upper layer made of a metal which is either the same metal as the second interconnection layer or Pt.

In the present invention, after the conductive subbing layer is deposited on the surface side of the semiconductor substrate in the subbing layer forming step, the first interconnection layer is formed by plating on the surface of the conductive subbing layer. At this time, the conductive subbing layer is left unremoved. After the surface of the first interconnection layer is covered with a mask having windows corresponding to the portions constituting the metal connection layer, the semiconductor substrate is plated using the conductive subbing layer as an electrode so as to form the metal connection layer in the windows. Thereafter, the conductive subbing layer is removed from the substrate surface regions which are not covered by portions of the first interconnection layer. In that state, the metal connection layer is buried in the interlayer insulating film in such a manner that the tops of the metal connection layer portions are exposed.

Subsequently, the second interconnection layer is formed by repeating the above processes or by sputtering. In this way, the second interconnection layer is electrically connected to the metal connection layer which is exposed through the interlayer insulating film, which is in turn electrically connected to the first interconnection layer. As the metal connection layer is formed by plating on the surface of the first interconnection layer before the interlayer insulating film is formed, it is not necessary to fill the connection holes in the interlayer insulating film, as in the conventional case. Hence, the metal connection layer adheres well to the first interconnection layer, and no void is generated in the metal connection layer even when the metal connection layer is thick. It is therefore possible to provide an interconnection structure which has a low interconnection resistance and which is capable of preventing generation of electromigration and thereby improves the initial characteristics and reliability of the semiconductor device.

BRIEF DESCRIPTION OF THE DRAWING

FIGS. 6(a) to 6(d) are cross-sectional views show successive steps in a method of manufacturing a conventional semiconductor device.

DESCRIPTION OF THE PREFERRED EMBODIMENTS

An embodiment of an interconnection structure for a semiconductor device according to the present invention will be described with reference to FIG. 1.

Figure 1:
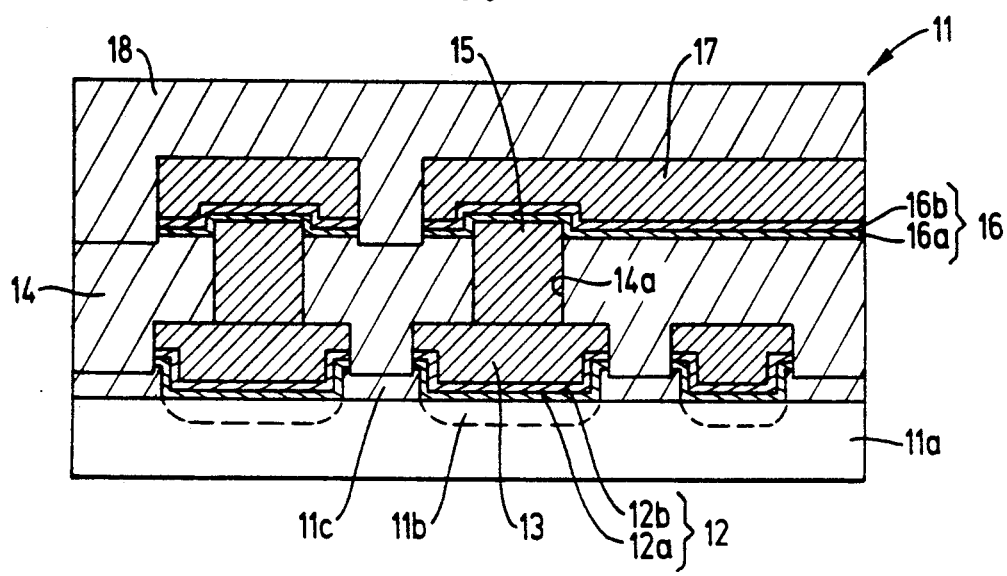
FIG. 1 is a cross-sectional view of a semiconductor device according to an embodiment of the present invention.

In FIG. 1, which is a cross-sectional view of a semiconductor device 11 according to the invention, device 11 includes one or more semiconductor areas 11b formed on the surface side of a silicon substrate 11a. The portion of the surface of the silicon substrate 11a on which semiconductor areas 11b are not formed is coated with a silicon oxide film 11c. Device 11 also has a conductive subbing layer 12 deposited on the surface side of the silicon substrate 11a in areas 11b.

The conductive subbing layer 12 consists of a Ti layer 12a having a thickness of about 10 nm and serving as the lower layer, and an Au layer 12b having a thickness of about 100 nm and serving as the upper layer. On the surface of the conductive subbing layer 12 is plated a first Au interconnection layer 13 having discrete portions associated with respective areas 11b. The first Au interconnection layer 13 has a thickness of about 700 nm and each portion thereof is electrically connected to a respective semiconductor area 11b via the associated conductive subbing layer 12.

Device 11 also has an interlayer insulating film 14 on the first Au interconnection layer 13. Film 14 is provided with a pattern of through holes 14a within which are deposited discrete portions of an Au connection layer, or metal connection layer, 15. The Au connection layer 15 is formed by plating onto surfaces of first Au interconnection layer 13 which are exposed by holes 14a. The connection holes 14a are not opened in the interlayer insulating film 14 but are formed by depositing the interlayer insulating film 14 as if the Au connection layer 15 laid on the first Au interconnection layer 13 is already present. The tops of the discrete portions of Au connection layer 15 protrude from the surface of interlayer insulating film 14.

The semiconductor device 11 also has a patterned conductive subbing layer 16 on the insulating film 14 and a patterned second Au interconnection layer 17 electrically connected to the Au connection layer 15 via conductive subbing layer 16. The conductive subbing layer 16 consists of a Ti layer 16a having a thickness of about 10 nm, and an Au layer 16b having a thickness of about 100 nm. Ti layer 16a serves as the lower layer of the conductive subbing layer 16 and the Au layer 16b serves as the upper layer. The second Au interconnection layer 17 and the first Au interconnection layer 13 together form a multilayer interconnection structure by which electrical connections are provided through interlayer insulating film 14.

Device 11 also has a surface insulating film 18 formed on the second Au interconnection layer 17 and contacting film 14 in the regions between the portions of layers 16 and 17.

Next, an advantageous method of manufacturing the semiconductor device 11 arranged in the manner described above will be described with reference to FIGS. 1 and 2(a) to 2(k).

Figure 2A:
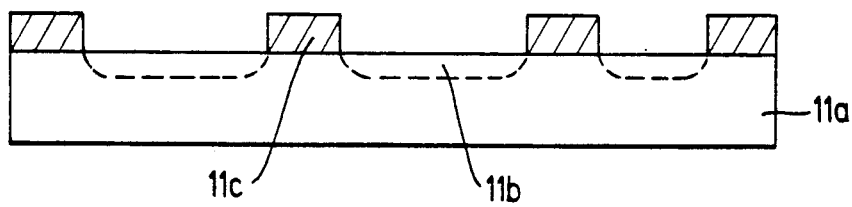
FIGS. 2(a) to 2(k) show successive stages in the fabrication of the semiconductor device shown in FIG. 1 in accordance with the invention.

FIGS. 2(a) to 2(k) are cross-sectional views of the semiconductor device at successive stages of the manufacturing process. FIG. 2(a) shows the silicon substrate 11a with no interconnection layers formed thereon yet but with the semiconductor areas 11b and the silicon oxide film 11c formed at the upper surface thereof.

Figure 2B:
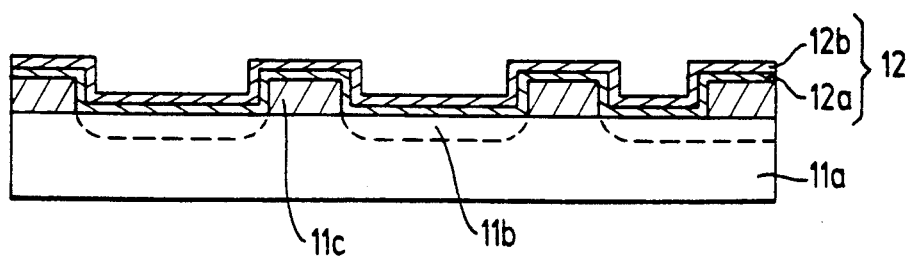

First, as shown in FIG. 2(b), the Ti layer 12a is deposited over the entire surface of silicon substrate 11 to a thickness of about 10 nm by sputtering, and then the Au layer 12b is deposited onto the surface of Ti layer 12a to a thickness of about 100 nm so as to form the conductive subbing layer 12, this being the subbing layer formation process.

Figure 2C:
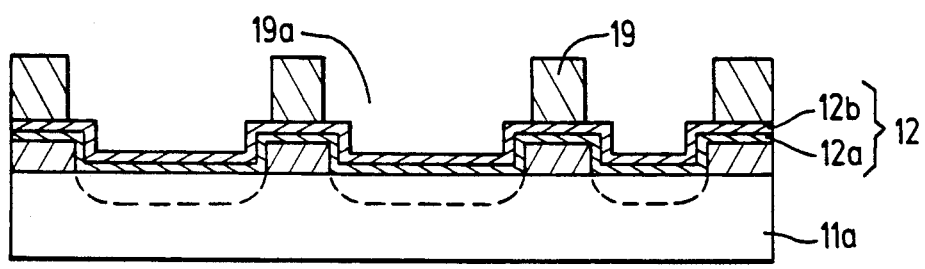

Next, as shown in FIG. 2(c), a positive type photoresist layer 19 is coated on the surface of conductive subbing layer 12 to a thickness of about 1μ, and then window portions 19a, corresponding to the patterned interconnection area of the first interconnection layer 13, is formed to establish a mask for an that interconnection layer.

Figure 2D:
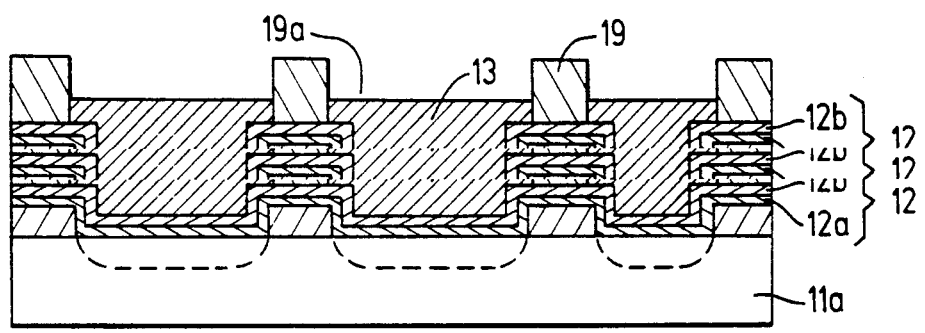

Thereafter, in the first interconnection layer forming process, as shown in FIG. 2(d), plating is carried out, using conductive subbing layer 12 as the electrode for connection to a power supply, by immersing the silicon substrate 11 in an Au plating bath, and an Au film is thus caused to grow from the portion of the surface of the conductive subbing layer 12 located in the window portions 19a, so as to form the about 100 nm thick first Au interconnection layer 13 in the window portions 19a.

Figure 2E:
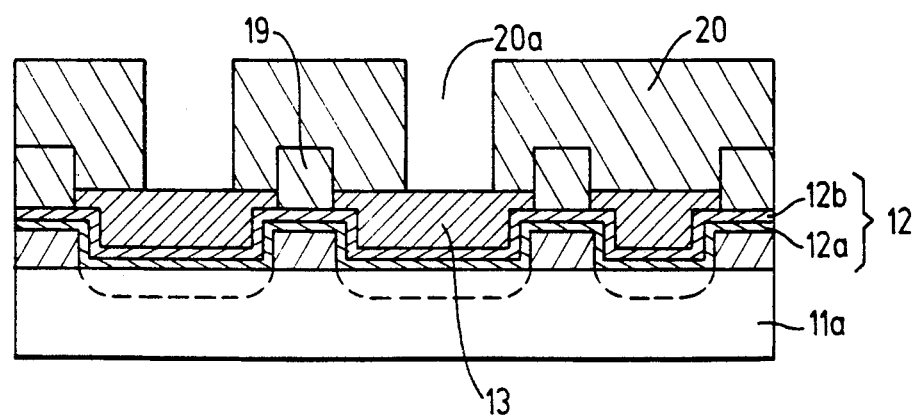

Thereafter, as shown in FIG. 2(e), a positive type photoresist layer 20 is applied to a thickness of about 1μ from above the silicon substrate 11a, and then, as part of the mask forming process, window portions 20a are formed at the areas where the portions of metal connection layer 15 are to be formed. At that time, the photoresist material of layer 20 is thoroughly removed from the interior of the window portion 20a so that no photoresist material is left therein.

Figure 2F:
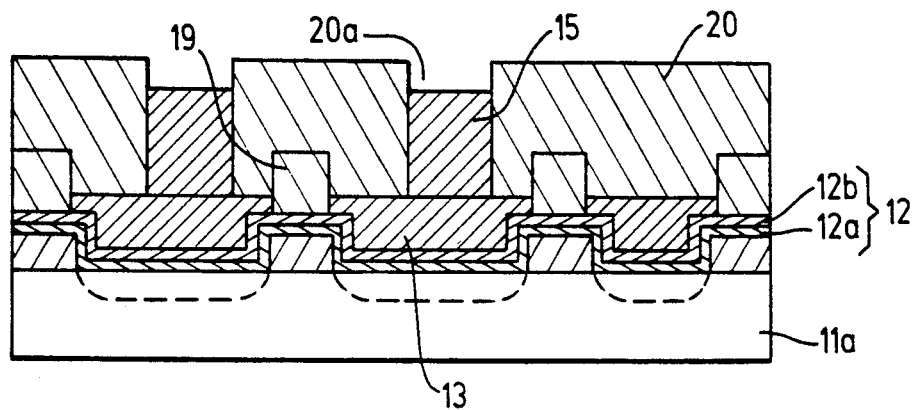

Next, as shown in FIG. 2(f), the metal connection layer forming process is performed. This includes a plating operation, using the conductive subbing layer 12 as the electrode for a power supply, by immersing the silicon substrate 11a in the Au plating bath, and the Au connection layer 15 is thereby formed to a thickness of about 1μ on the surface areas of first Au interconnection layer 13 which are located in the window portions 20a.

Figure 2G:
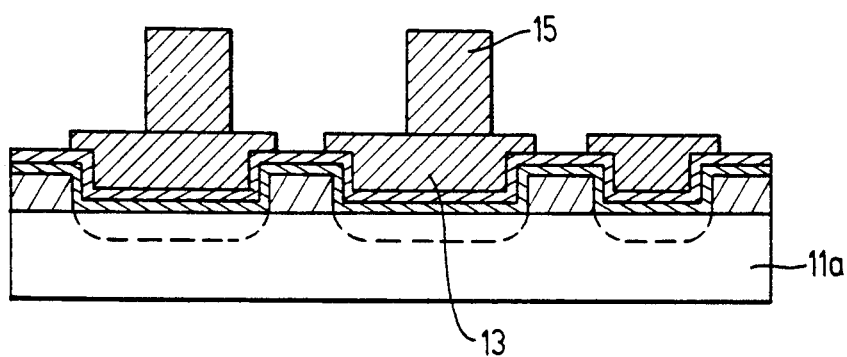

Next, the mask removing process represented in FIG. 2(g), the photoresist layers 19 and 20 formed on silicon substrate 11a are removed. This provides a state in which the Au connection layer portions 15 are laid on the first Au interconnection layer 13.

Figure 2H:
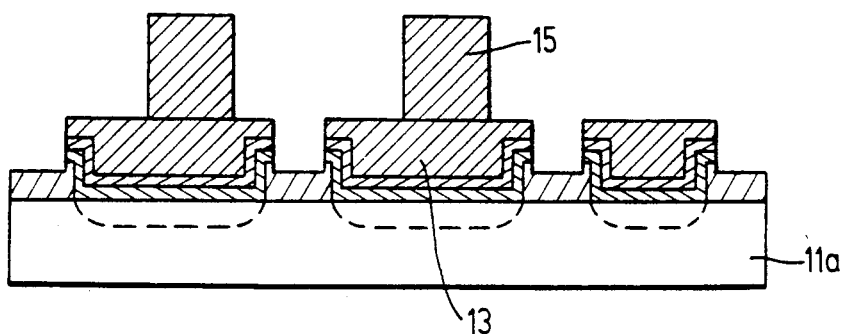

Next, the subbing layer removing process is performed. This includes dry etching of the silicon substrate 11a conducted in a gas mixture of CF₄ and O₂, as shown in FIG. 2(h). At that time, the first Au interconnection layer 13 is used as the mask for dry etching, and the conductive subbing layer 12 and an upper portion of the silicon oxide film 11c in the areas on which no first Au interconnection layer 13 is formed are removed.

Figure 2I:
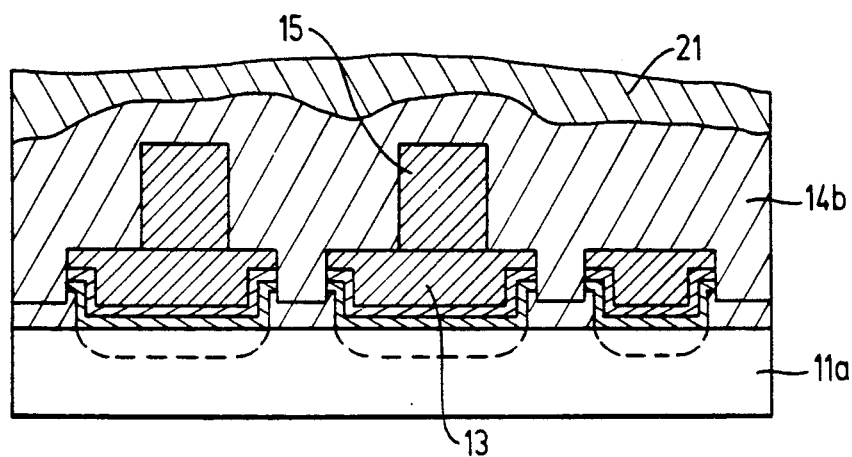

Subsequently, as shown in FIG. 2(i), silicon oxide film 14b is deposited to a thickness of about 1.5μ from above the silicon substrate 11 by a plasma CVD process, and then a resist layer 21 is coated onto the surface of silicon oxide film 14b so as to make the surface flat.

Figure 2J:
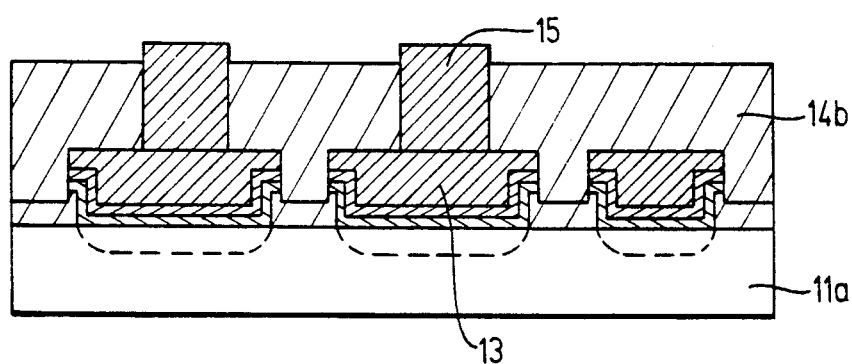

In that state, as shown in FIG. 2(j), resist layer 21 and a surface portion of silicon oxide film 14b are removed by plasma etching. Plasma etching is conducted under the condition that the etching rate of the silicon oxide film 14b and that of the resist layer 21 are the same (etch back process) so that the remaining silicon oxide film 14b has a flat surface suitable for its role as an interlayer insulating film. Plasma etching continues until the tops of the portions of Au connection layer 15 protrude from the surface of interlayer insulating film 14. These steps represent the insulating film forming process.

Figure 2K:
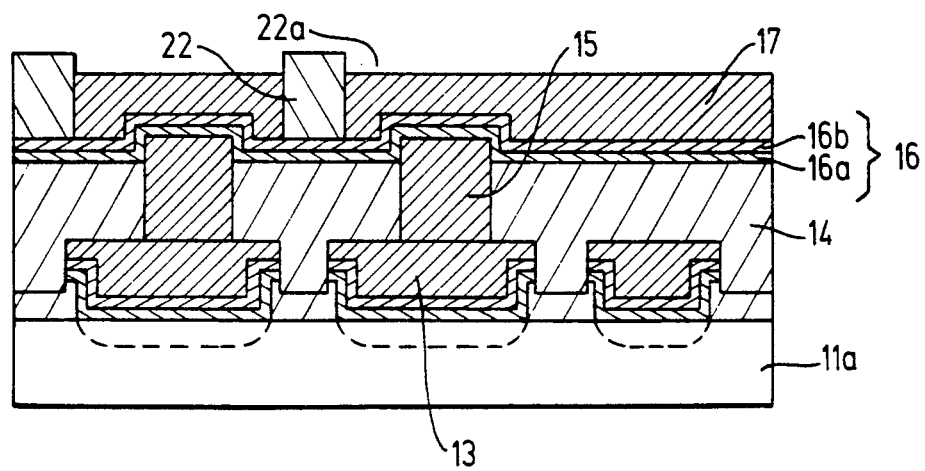

Thereafter, as shown in FIG. 2(k), the second interconnection layer is formed by repeating the same processes starting with the subbing layer forming process to form subbing layer 16 and ending with the Au interconnection layer forming process to form second interconnection layer 17.

That is, the Ti layer 16a is first deposited by sputtering on the surface side of the interlayer insulating film 14 to a thickness of about 10 nm, and then the Au layer 16b is deposited on the surface of the Ti layer 16a to a thickness of about 100 nm so as to form the conductive subbing layer 16. Thereafter, the positive type photoresist layer 22 is coated to a thickness of about 1μ on the surface of the conductive subbing layer 16, and then window portions 22a, corresponding to the patterned interconnection area of the second interconnection layer, are formed, as shown in FIG. 2(k). Next, plating is conducted, using the second conductive subbing layer 16 as the electrode for a power supply, by immersing the silicon substrate 11a in the Au plating bath, and the Au film is thereby caused to grow from the portions of the surface of the second conductive subbing layer 16 which are located in the window portions 22a so as to form the second Au interconnection layer 17 having a thickness of 700 nm. Next, the photoresist layer 22 is removed, and then dry etching of the silicon substrate 11 is conducted in the mixture gas of CF$_4$ and O$_2$. At that time, the second Au interconnection layer 17 is used as the mask for dry etching, and the second conductive subbing layer 16 and the surface of the interlayer insulating film 14 formed on the area on which the second Au interconnection layer 17 is not formed are removed.

Thereafter, the surface insulating film 18 is deposited, thereby completing the multilayer interconnection structure for the semiconductor device 11 shown in FIG. 1.

In the present embodiment, the conductive subbing layer 12 is left unremoved until after the first Au interconnection layer 13 is formed so that it can be used as the power supply electrode for the plating in which the Au connection layer 15 is grown only from the surface of the first Au interconnection layer 13, the Au connection layer 15 being buried in the interlayer insulating film 14. Therefore, even when the Au connection layer 15 is thick, it adheres well to the first Au interconnection layer 13. Also, no void is generated in the Au connection layer 15. Furthermore, since the Au connection layer 15 protrudes from the surface of the interlayer insulating film 14 toward the second Au interconnection layer 17, the contact area between the Au connection layer 15 and the second Au interconnection layer 17 is large and the Au connection layer 15 is closely connected to the second Au interconnection layer 17.

Consequently, in the interconnection structure according to this embodiment, the electric interconnection resistance is low at the initial stage and generation of electromigration which would occur with time is eliminated. As a result, excellent initial characteristics and reliability can be provided and the thickness of the interlayer insulating film can be reduced in the design and manufacture of the semiconductor device.

Furthermore, since the conductive subbing layer 12, consisting of the Ti layer 12a which adheres well to the oxide film and the upper layer 12b made of the same material as the interconnection layer, Au, is present between the interconnection layer portions 13 and silicon oxide film portions 11b and a similar subbing layer 16 is present between second Au interconnection layer 17 and interlayer insulating film 14, the first and second Au interconnection layers 13 and 17, respectively, adhere well to the silicon oxide film 11b and the interlayer insulating film 14. Furthermore, since the first Au interconnection layer 13, the Au connection layer 15 and the second Au interconnection layer 17 are all formed of Au, they have a low electric resistance and do not readily experience corrosion, and hence disconnection, due to impurities.

It is possible to form an interconnection structure having three or more layers which exhibits excellent initial characteristics and reliability by repeating the processes ranging from the subbing layer forming process to the insulating film forming process prior to the second interconnection layer forming process.

Figure 3:
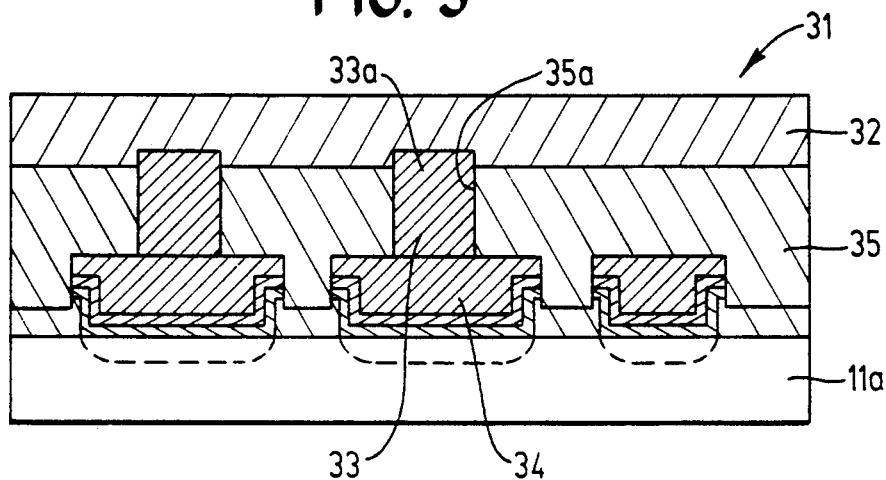
FIG. 3 is a cross-sectional view of a semiconductor device having a second Au interconnection layer which is different from that of the semiconductor device shown in FIG. 1.

In this embodiment, plated interconnection layers have been used to form multilayer interconnection structures. However, the second interconnection layer may also be formed by depositing the Au layer by sputtering. FIG. 3 is a cross-sectional view of a semiconductor device manufactured in this way.

In FIG. 3, portions of a second Au interconnection layer 32 of a semiconductor device 31 are directly connected to the tops 33a of portions of an Au connection layer 33 which are in turn electrically connected to portions of a first Au interconnection layer 34 through the Au connection layer 33.

In this semiconductor device 31, an interlayer insulating film 35 is formed in such a manner that the tops 33a of the portions of Au connection layer 33 protrude therefrom, as in the case of the semiconductor device described previously, and then the second Au interconnection layer 32 is deposited on protruding tops of Au connection layer 33 by sputtering. Consequently, since it is not necessary to fill the interiors of connection holes 35a with the interlayer insulating film, as in the case of the conventional manufacturing method, excellent initial characteristics and reliability of the interconnection structure can be achieved even when the second interconnection layer is deposited by sputtering on the thick interlayer insulating film 35.

Figure 4:
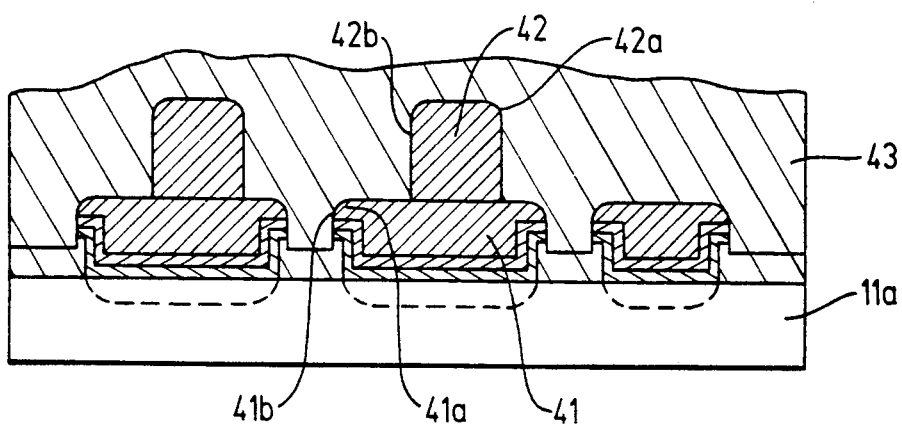
FIG. 4 shows a step in the fabrication process according to a feature of the invention to produce a structure which differs somewhat from that of the embodiment shown in FIG. 1.

In the first-described embodiment, the conductive subbing layer (12) is partially removed by dry etching using a gas mixture of CF$_4$ and O$_2$. This is the process step shown in FIG. 1(h). However, dry etching may be conducted using a CF$_4$ gas alone. Alternatively, ion milling which employs an inactive gas, such as Ar gas, may be utilized. Etching conditions may be set such that the upper surface of the Au interconnection layer (13) and the upper surface of the Au connection layer (15) are removed together with the conductive subbing layer. In that case, as shown in FIG. 4, corner regions 41a and 42a of the discrete portions of Au interconnection layer 41 and Au connection layer 42, which are located on the peripheries of the upper surfaces thereof, are removed and thus these upper surfaces become curved. Hence, a silicon oxide film 43 can be reliably deposited from above the silicon substrate 11a on the corner regions 41a and 42a of the first Au interconnection layer 41 and Au connection layer 42. The deposited silicon oxide film 43 lies close to side surfaces 41b and 42b of the interconnection and connection layer portions.

Figure 5A:
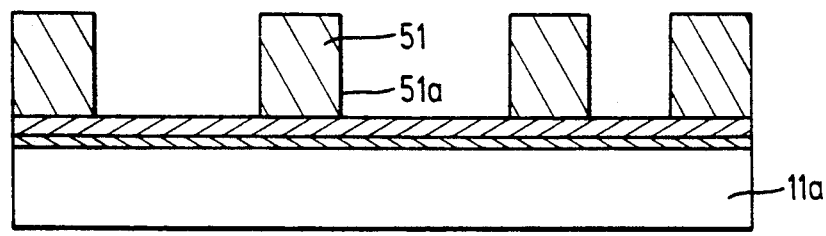
FIGS. 5(a) and 5(b) show the structure of a first type of photoresist layer used in interconnection layer forming processes.
Figure 5B:
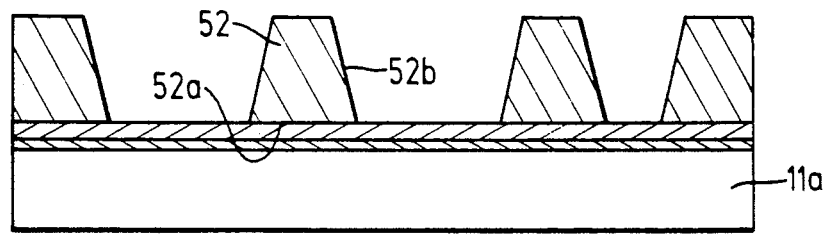

A negative type photoresist may be used for forming an interconnection layer by plating in place of the positive type photoresist. Referring to FIGS. 5, and initially FIG. 5(a), in a positive type photoresist layer 51 in which window portions have been opened, side surfaces 51a of the window openings are essentially perpendicular to the silicon substrate 11a, or, as shown in FIG. 5(b), the window openings have inclined side surfaces 52b because the bottom surfaces 52a of the individual portions of photoresist layer 52 are broader than the top surfaces.

Figure 5C:
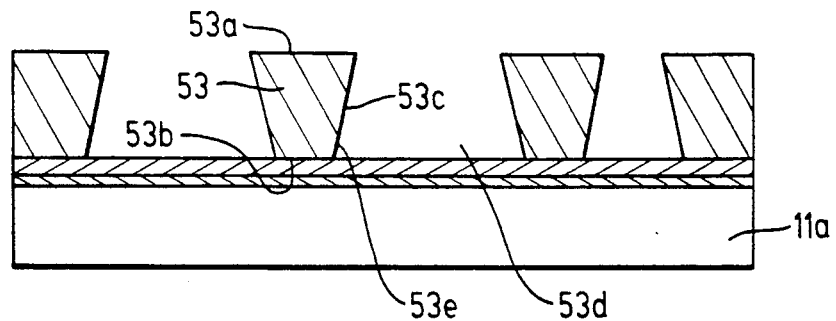
FIGS. 5(c) and 5(d) show the interconnection layer forming process which employs a second type of photoresist layer.

However, in the case of a negative type photoresist, as shown in FIG. 5(c), side surfaces 53c of the window portions of photoresist layer 53 become tapered such that top surfaces 53a of individual portions thereof are wider than the bottom surfaces 53b thereof, because the top surface of the resist layer is illuminated by light having a greater intensity than the light which reaches the bottom surface thereof. If window portions 53d are filled with an interconnection layer from above, the interconnection layer may not fill corner portions 53e sufficiently due to the presence of the overhanging top surface 53a.

Figure 5D:
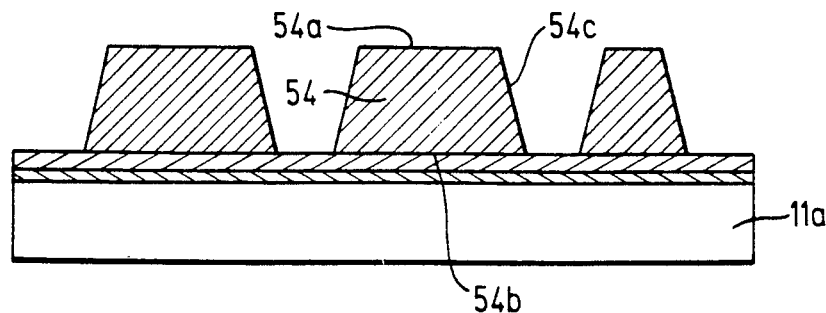
Figure 7:
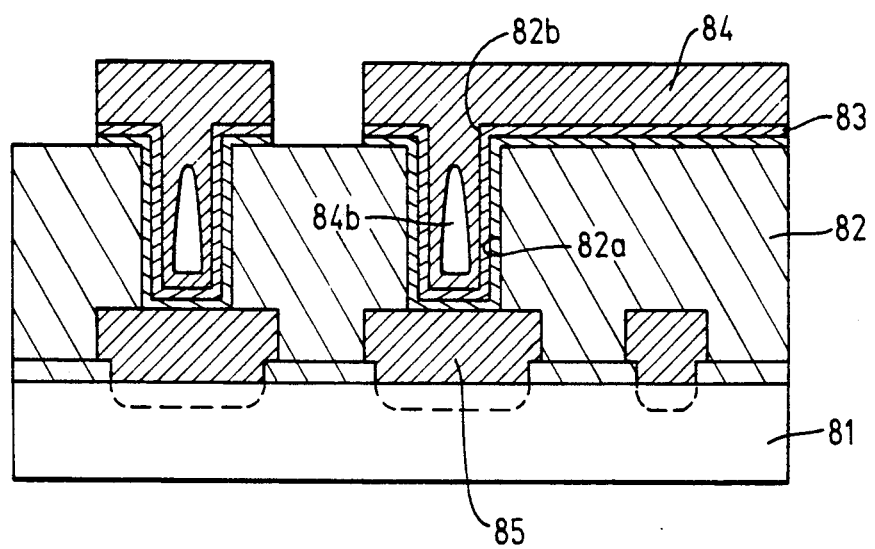
FIG. 7 is a cross-sectional view of another conventional semiconductor device.

However, in the case where the interconnection layer is formed by plating, growth of the interconnection layer starts from the bottom thereof and proceeds upward, and the corner portions 53e of the window portions 53d can thus be filled with the interconnection layer even when the resist 53 is formed in the manner shown in FIG. 5(c). As shown in FIG. 5(d), this results in the formation of discrete portions of an interconnection layer 54 whose side surfaces 54c taper such that the top surfaces 54a of the portions of layer 54 are narrower than the bottom surfaces 54b. In that case, as the interlayer insulating film which is coated from above can be laid reliably on the side surfaces 54c of the portions of interconnection layer 54, a more reliable interconnection structure can be provided.

In this embodiment, the conductive subbing layer has the two-layer structure which consists of the Ti layer and the Au layer. However, any conductive material which can be used as the power supply electrode during plating can be used. To improve the adhesion of the conductive subbing layer to the lower and upper layers, a Mo layer which adheres well to the oxide film may also be used as the lower layer which is directly deposited on the surface of the oxide film, while a Pt layer which adheres well to the plated interconnection layer may also be used as the upper layer on which the plated interconnection layer is deposited. Alternatively, a Ti or Mo layer, a Pt layer and a layer made of the same metal as that of the interconnection layer may also be used as lower, intermediate and upper layers, respectively, of a subbing layer. The interconnection layer may also be made of Ag or Cu.

In the above embodiment, the interlayer insulating film is formed by conducting the etch back process on the deposited silicon oxide film and resist layer. However, any other process capable of making the surface of the substrate flat can be used. For example, a phosphorus or boron phosphorus glass layer alone or a combination of the phosphorus or boron phosphorus glass layer and an insulating film, such as silicon oxide, silicon nitride, silicon oxynitride or a combination of such insulating films may also be used.

In addition to DC, pulse and PR electroplating which use a current waveform, electroless plating or a combination of electroplating and electroless plating may also be utilized.

In the above embodiment, the Au connection layer (metal connection layer) formed by plating is used to provide electrical connection between the first and second interconnection layers of the semiconductor substrate. However, the metal connection layer should be arranged at an optimum position which is determined by the function of the manufactured semiconductor device. A multilayer interconnection structure constructed by combining the conventional interconnection structure and the meta connection layer can be used.

In accordance with the present invention, and as has been described above, after the conductive subbing layer 12 has been applied to the top surface side of the semiconductor substrate 11, the first interconnection layer 13 is formed on the top surface of the conductive subbing layer 12, the metal connection layer 15 is deposited on the top surface of the first interconnection layer by plating utilizing the conductive subbing layer 12 as an electrode, and then the interlayer insulating film 14 is formed. Hence, the present invention has the following advantages.

(1) Since the metal connection layer is formed by plating, the metal connection layer grows exclusively from the surface of the first interconnection layer. Also, since the metal connection layer is formed before the interlayer insulating film is formed, the thickness of the interlayer insulating film does not affect formation of the metal connection layer. Consequently, the metal connection layer adheres well to the first interconnection layer, and has no voids in it. Therefore, even in a case where the interlayer insulating film is thick, it is possible to provide a multilayer interconnection structure which has a low initial interconnection resistance and which remains highly reliable during use.

(2) In a case where the upper portion of the metal connection layer protrudes from the surface of the interlayer insulating film, the contact area between the metal connection layer and the second interconnection layer can be increased, thus reducing the interconnection resistance and providing stable electrical connections.

(3) In a case where a mask formed of a negative type photoresist is used to form the first interconnection layer, the bottom of the individual portions of the first interconnection layer can be enlarged relative to the tops, as shown in FIG. 1(d). In that case, as the upper surface of the first interconnection layer does not block deposition of the interlayer insulating film on the side surfaces of the first interconnection layer portions, adhesion between the first interconnection layer and the interlayer insulating film can be improved.

(4) In a case where the conductive subbing layer includes a lower layer made of Ti or Mo and an upper layer made of the same metal as the second interconnection layer or Pt, the conductive subbing layer can be made to closely adhere to both the oxide film located below the conductive subbing layer and the interconnection layer located above the conductive subbing layer.

(5) In a case where the conductive subbing layer is removed by dry etching using the first interconnection layer as a mask, formation of the mask used to remove the conductive subbing layer can be eliminated.

This application relates to subject matter disclosed in Japanese Patent Application No. JP 146754/90 filed on Jun. 5, 1990, Japanese Patent Application No. JP 146753/90 filed on Jun. 5, 1990, and Japanese Patent Application No. JP 72810/91 filed on Apr. 5, 1991, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

I claim:

1. A semiconductor device having a multilayer interconnection structure, comprising: a semiconductor substrate having an upper surface provided with a patterned interconnection area containing semiconductor element regions; a conductive first subbing layer deposited on said patterned interconnection area; a first interconnection layer composed of first interconnection layer portions formed on said conductive first subbing layer by plating and electrically connected to said semiconductor element regions through said conductive subbing layer; a metal connection layer composed of connection layer portions formed on said first interconnection layer portions by plating; an interlayer insulating film deposited on said first interconnection layer portions around said metal connection layer portions for burying said metal connection layer portions in such a manner that the tops of said metal connection layer portions are exposed; and a second interconnection layer composed of second interconnection layer portions deposited on said interlayer insulating film and electrically connected to said first interconnection layer portions through said metal connection layer portions, wherein said first interconnection layer has a bottom which contacts said conductive subbing layer and a top which contacts said metal connection layer portions, and said first interconnection layer portions have tapered side surfaces oriented such that said first interconnection layer portions are smaller at said top than at said bottom.

2. A semiconductor device according to claim 1 wherein said metal connection layer portions have tops which protrude from the surface of said interlayer insulating film.

3. A semiconductor device according to claim 2 wherein said first interconnection layer portions and said metal connection layer have upper surfaces with peripheries which are curved.

4. A semiconductor device according to claim 3 wherein said first interconnection layer, said metal connection layer and said second interconnection layer are each made of a metal selected from the group consisting of Au, Ag and Cu.

5. A semiconductor device according to claim 4 wherein said conductive subbing layer includes a lower layer made of a metal selected from the group consisting of Ti and Mo, and an upper layer made of a metal selected from the group consisting of the same metals as said second interconnection layer and Pt.

* * * * *